US 12,189,890 B2

(12) United States Patent
Fang et al.

(10) Patent No.: US 12,189,890 B2
(45) Date of Patent: Jan. 7, 2025

(54) DISPLAY PANEL AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Fei Fang, Beijing (CN); Zhu Wang, Beijing (CN); Ling Shi, Beijing (CN); Bo Yang, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/258,007

(22) PCT Filed: Feb. 9, 2021

(86) PCT No.: PCT/CN2021/076180
§ 371 (c)(1),
(2) Date: Jun. 16, 2023

(87) PCT Pub. No.: WO2022/170458
PCT Pub. Date: Aug. 18, 2022

(65) Prior Publication Data
US 2024/0053855 A1 Feb. 15, 2024

(51) Int. Cl.
*G06F 3/041* (2006.01)
*G06F 3/044* (2006.01)
(Continued)

(52) U.S. Cl.
CPC .......... *G06F 3/04164* (2019.05); *G06F 3/044* (2013.01); *G06F 3/0443* (2019.05);
(Continued)

(58) Field of Classification Search
CPC .... G06F 3/04164; G06F 3/044; G06F 3/0443; G06F 2203/04107; G06F 3/0412;
(Continued)

(56) References Cited

U.S. PATENT DOCUMENTS

2015/0145808 A1  5/2015  Cho et al.
2016/0026289 A1* 1/2016  Liu ..................... G09G 3/2003
                                                    345/174

(Continued)

FOREIGN PATENT DOCUMENTS

CN    104615296 A    5/2015
CN    104866126 A    8/2015
(Continued)

OTHER PUBLICATIONS

International Search Report and Written Opinion, mailed Nov. 1, 2021, from PCT/CN2021/114954, 16 pages.
(Continued)

*Primary Examiner* — Sahlu Okebato
(74) *Attorney, Agent, or Firm* — Workman Nydegger

(57) ABSTRACT

A display panel, including: a substrate base plate; touch electrodes; touch lead wires on the substrate base plate, one end of the touch lead wire is coupled with the touch electrode, the other end thereof is in a peripheral area, the touch lead wires in the display panel are divided into touch lead wire sets, each touch lead wire set includes touch lead wires; data lead wires on the substrate base plate in the peripheral area, the data lead wires are divided into data lead wire sets, each data lead wire set includes data lead wires, the touch lead wire sets and the data lead wire sets are distributed in a staggered manner; at least one shielding line on the substrate base plate in the peripheral area, an ortho- (Continued)

graphic projection of the shielding line is between orthographic projections of the touch lead wire and the data lead wire.

16 Claims, 8 Drawing Sheets

(51) Int. Cl.
*H10K 59/131* (2023.01)
*H10K 59/40* (2023.01)
*H10K 59/80* (2023.01)

(52) U.S. Cl.
CPC .......... *H10K 59/131* (2023.02); *H10K 59/40* (2023.02); *H10K 59/873* (2023.02); *G06F 2203/04107* (2013.01)

(58) Field of Classification Search
CPC ..... G06F 3/041; G06F 3/0446; H10K 59/131; H10K 59/40; H10K 59/873
See application file for complete search history.

(56) References Cited

U.S. PATENT DOCUMENTS

| | | | | |
|---|---|---|---|---|
| 2016/0291776 | A1* | 10/2016 | Li | .................. G06F 3/04164 |
| 2017/0123572 | A1 | 5/2017 | Song et al. | |
| 2020/0033967 | A1 | 1/2020 | Yang et al. | |
| 2020/0117313 | A1* | 4/2020 | Zhang | .................. G06F 3/0446 |
| 2020/0176540 | A1 | 6/2020 | Park et al. | |
| 2021/0026474 | A1 | 1/2021 | Yi et al. | |
| 2021/0176903 | A1 | 6/2021 | Tian et al. | |
| 2022/0100342 | A1 | 3/2022 | Wang et al. | |
| 2022/0206606 | A1* | 6/2022 | Ye | .................. G06F 3/0443 |
| 2022/0216290 | A1 | 7/2022 | Zheng et al. | |

FOREIGN PATENT DOCUMENTS

| | | |
|---|---|---|
| CN | 105302367 A | 2/2016 |
| CN | 105652498 A | 6/2016 |
| CN | 105824448 A | 8/2016 |
| CN | 106527816 A | 3/2017 |
| CN | 106990878 A | 7/2017 |
| CN | 107479283 A | 12/2017 |
| CN | 109856874 A | 6/2019 |
| CN | 110244873 A | 9/2019 |
| CN | 110389686 A | 10/2019 |
| CN | 110764659 A | 2/2020 |
| CN | 111459320 A | 7/2020 |
| CN | 112198983 A | 1/2021 |
| CN | 112768495 A | 5/2021 |

OTHER PUBLICATIONS

International Search Report and Written Opinion, mailed Nov. 15, 2021, from PCT/CN2021/076180, 13 pages.
US Non-Final Office Action, mailed Oct. 16, 2023, from U.S. Appl. No. 17/757,208, filed Jun. 10, 2022, 22 pages.

* cited by examiner

DISPLAY PANEL AND DISPLAY DEVICE

CROSS REFERENCE TO RELATED APPLICATION

The present disclosure is a National Stage of International Application No. PCT/CN2021/076180, filed on Feb. 9, 2021, which is incorporated in its entirety herein by reference.

TECHNICAL FIELD

The present disclosure relates to the technical field of display, and in particular to a display panel and a display device.

BACKGROUND

An organic light-emitting diode (OLED) features self-luminescence, rapid reaction, a wide viewing angle, high brightness, brilliant color, thinness, etc. When the OLED employs a touch display driver integration (TDDI) chip, both touch leads and data leads are utilized in the TDDI chip. Since an abundance of touch leads are configured in the OLED, the coupling capacitance between the touch leads and the data leads will lead to mutual interference between touch signals and data signals.

SUMMARY

A display panel is provided in an embodiment of the present disclosure. The display panel includes: a display area and a peripheral area positioned on at least one side of the display area; where the display panel further includes: a substrate; a plurality of touch electrodes, at least some of which are positioned on a portion, in the display area, of the substrate; a plurality of touch leads positioned on the substrate, one ends of the touch leads being coupled to the touch electrodes, the other ends thereof being positioned in the peripheral area, the plurality of touch leads in the display panel being divided into a plurality of touch lead sets, and the touch lead set including the plurality of touch leads; a plurality of data leads positioned on a portion, in the peripheral area, of the substrate, the plurality of data leads in the display panel being divided into a plurality of data lead sets, the data lead set including the plurality of data leads, and at least some of the touch lead sets and some of the data lead sets being alternately distributed; and at least one shielding line positioned on the portion, in the peripheral area, of the substrate, an orthographic projection, on the substrate, of the shielding line being positioned between an orthographic projection, on the substrate, of the touch lead and an orthographic projection, on the substrate, of the data lead.

Alternatively, in the embodiment of the present disclosure, the peripheral area includes a first fan-out area, a second fan-out area positioned on one side, away from the display area, of the first fan-out area, and a bendable area positioned between the first fan-out area and the second fan-out area; where the shielding line is positioned in at least one of the first fan-out area, the bendable area, and the second fan-out area.

Alternatively, in the embodiment of the present disclosure, the display panel further includes: a plurality of first electrodes, second electrodes positioned on one sides, facing away from the substrate, of the first electrodes, and light-emitting layers positioned between the first electrodes and the second electrodes; where the orthographic projection, on the substrate, of the shielding line overlaps an orthographic projection, on the substrate, of the second electrode and does not overlap an orthographic projection, on the substrate, of the touch electrode.

Alternatively, in the embodiment of the present disclosure, the display panel further includes: an encapsulation layer positioned on one side, facing away from the substrate, of the second electrode; where the shielding line includes a first shielding sub-line and a second shielding sub-line; the first shielding sub-line is positioned on one side, facing away from the substrate, of the encapsulation layer; the second shielding sub-line is positioned on one side, close to the substrate, of the first electrode; an orthographic projection, on the substrate, of a first end of the first shielding sub-line is positioned within a range of the orthographic projection, on the substrate, of the second electrode, and a second end of the first shielding sub-line is positioned in the first fan-out area; the second shielding sub-line is positioned in the first fan-out area, the bendable area, and the second fan-out area; and the second end of the first shielding sub-line is coupled to the second shielding sub-line through a first via hole, the first via hole penetrating an insulation layer between the first shielding sub-line and the second shielding sub-line.

Alternatively, in the embodiment of the present disclosure, the touch lead includes a first lead portion and a second lead portion; where the first lead portion is positioned on one side, facing away from the substrate, of the encapsulation layer; the second lead portion is positioned on one side, close to the substrate, of the first electrode; a first end of the first lead portion is coupled to the touch electrode, and a second end thereof is positioned in the first fan-out area; the second lead portion is positioned in the first fan-out area, the bendable area, and the second fan-out area; a second end of the first lead portion is coupled to the second lead portion through a first through hole, the first through hole penetrating an insulation layer between the first lead portion and the second lead portion; and the second shielding sub-line is positioned on the same film layer as the second lead portion.

Alternatively, in the embodiment of the present disclosure, the first shielding sub-line includes: a first wire and a second wire positioned on one side, close to the substrate, of the first wire, where the first wire is coupled to the second wire through a second through hole, the second through hole penetrating an insulation layer between the first wire and the second wire; and the first lead portion includes a first lead and a second lead positioned on one side, close to the substrate, of the first lead, where the first lead is coupled to the second lead through a third through hole, the third through hole penetrating an insulation layer between the first lead and the second lead; where the first wire is positioned on the same film layer as the first lead, and the second wire is positioned on the same film layer as the second lead.

Alternatively, in the embodiment of the present disclosure, the shielding line further includes: a third shielding sub-line positioned in the second fan-out area; where the third shielding sub-line is positioned on one side, close to the substrate, of the second shielding sub-line; and the second shielding sub-line is coupled to the third shielding sub-line through a second via hole, the second via hole penetrating an insulation layer between the second shielding sub-line and the third shielding sub-line, and the second via hole being positioned in the second fan-out area.

Alternatively, in the embodiment of the present disclosure, the shielding line further includes: a fourth shielding sub-line positioned in the second fan-out area; where the fourth shielding sub-line is positioned on one side, close to the substrate, of the third shielding sub-line; and the third shielding sub-line is coupled to the fourth shielding sub-line through a third via hole, the third via hole penetrating an insulation layer between the third shielding sub-line and the fourth shielding sub-line.

Alternatively, in the embodiment of the present disclosure, in the peripheral area, the plurality of data leads in the display panel are divided into a plurality of first data leads positioned on a first metal layer and a plurality of second data leads positioned on a second metal layer, the second metal layer being positioned on one side, close to the substrate, of the first metal layer; where orthographic projections, on the substrate, of the first data leads and orthographic projections, on the substrate, of the second data leads are alternately distributed.

Alternatively, in the embodiment of the present disclosure, the fourth shielding sub-line is arranged on the same layer as at least one of the first data lead and the second data lead.

Alternatively, in the embodiment of the present disclosure, the shielding line is positioned in a gap between the touch lead set and the data lead set.

Alternatively, in the embodiment of the present disclosure, the display panel includes a plurality of shielding lines; and the plurality of shielding lines in the display panel include a plurality of ground lines, where at least one ground line is arranged in a gap between the touch lead set and the data lead set that are adjacent to each other.

Alternatively, in the embodiment of the present disclosure, the plurality of shielding lines in the display panel further include: a plurality of suspended touch leads; where at least one suspended touch lead is arranged in the gap between the touch lead set and the data lead set that are adjacent to each other, the suspended touch lead being positioned between the ground line and the touch lead set.

Alternatively, in the embodiment of the present disclosure, the display panel further includes: a touch shielding line positioned on the substrate; where the peripheral areas include: a first peripheral area and a second peripheral area that are arranged opposite each other, and a third peripheral area and a fourth peripheral area that are arranged opposite each other, the shielding line being positioned in the first peripheral area; and a first end and a second end of the touch shielding line are positioned in the first peripheral area, and the touch shielding line passes through the second peripheral area, the third peripheral area, and the fourth peripheral area and surrounds each touch electrode in the display panel.

Alternatively, in the embodiment of the present disclosure, the touch shielding lines in the display panel include: a first touch shielding line and a second touch shielding line, where the second touch shielding line is positioned on one side, close to the touch electrode, of the first touch shielding line.

Alternatively, in the embodiment of the present disclosure, the first touch shielding line includes a first touch shielding sub-line and at least two second touch shielding sub-lines; where the first touch shielding sub-line is positioned in the second peripheral area, the third peripheral area, and the fourth peripheral area; and the second touch shielding sub-line is coupled to the first touch shielding sub-line and positioned in the first peripheral area.

Alternatively, in the embodiment of the present disclosure, in the second peripheral area, the third peripheral area, and the fourth peripheral area, the first touch shielding line has a greater line width than the second touch shielding line.

Correspondingly, a display device is further provided in an embodiment of the present disclosure. The display device includes any one of the above display panels.

DETAILED DESCRIPTION

Aiming at the mutual interference between touch signals and data signals in an organic light-emitting diode (OLED), a display panel and a display device are provided in embodiments of the present disclosure.

The particular implementation modes of the display panel and the display device according to the embodiments of the present disclosure are described in detail below in combination with the accompanying drawings. A thickness and a shape of each film layer in the accompanying drawings do not reflect true proportions, and are merely illustrative of contents of the present disclosure.

Figure 1:
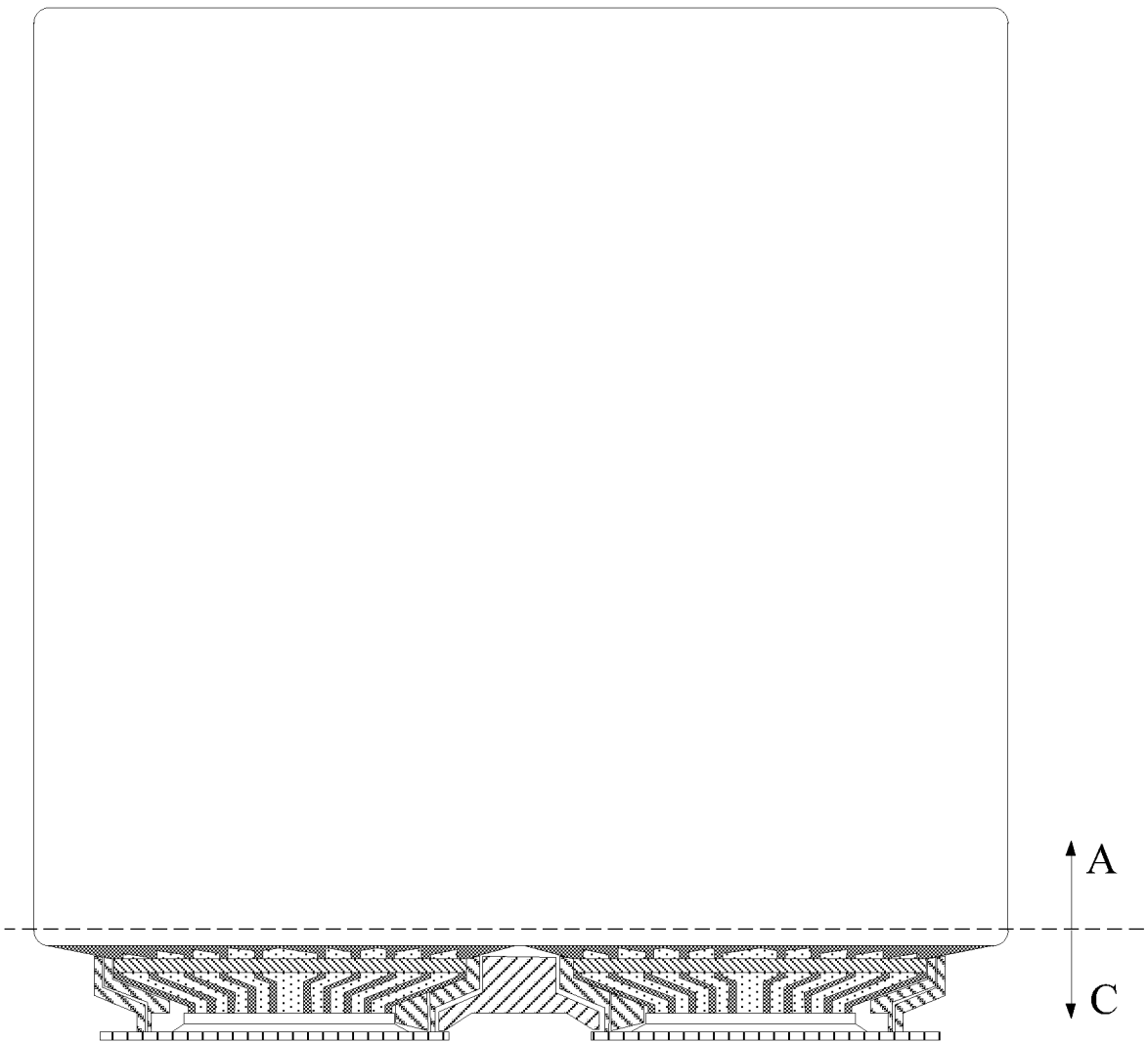
FIG. 1 is a schematic planar structural diagram of a display panel according to an embodiment of the present disclosure.
Figure 2:
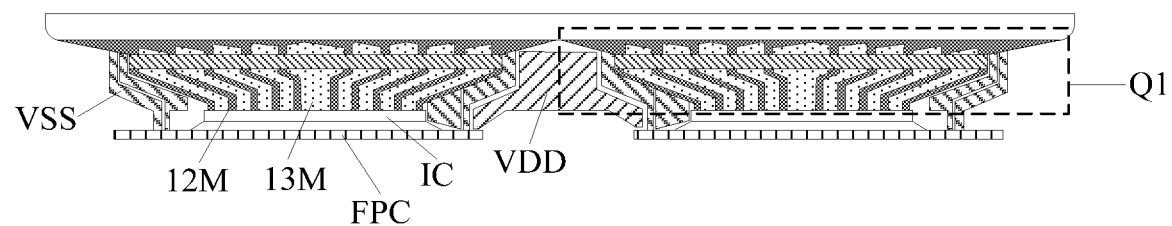
FIG. 2 is an enlarged schematic diagram of a peripheral area C in FIG. 1.
Figure 3:
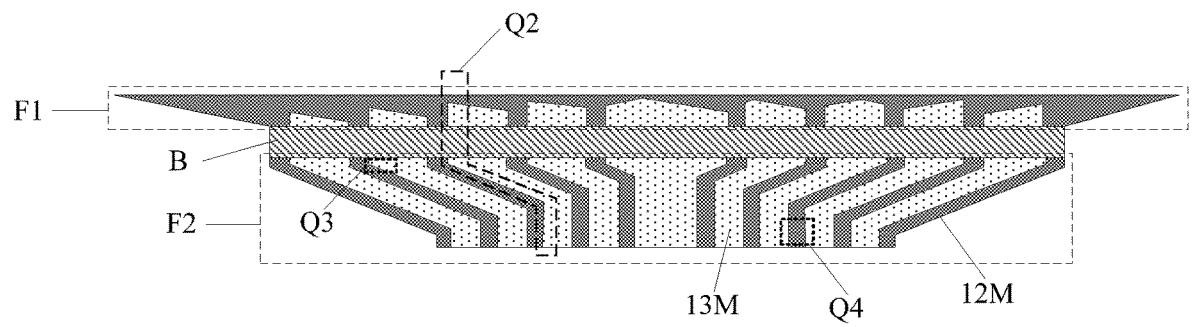
FIG. 3 is an enlarged schematic diagram at dashed box Q1 in FIG. 2.

FIG. 1 is a schematic planar structural diagram of a display panel according to an embodiment of the present disclosure. As shown in FIG. 1, the display panel according to the embodiment of the present disclosure may include: a display area A and a peripheral area C positioned on at least one side of the display area A. FIG. 2 is an enlarged schematic diagram of the peripheral area C in FIG. 1. FIG. 3 is an enlarged schematic diagram at dashed box 01 in FIG. 2. With reference to FIGS. 1-3, the above peripheral area C may include: a first fan-out area F1, a second fan-out area F2 positioned on one side, away from the display area A, of the first fan-out area F1, and a bendable area B positioned between the first fan-out area F1 and the second fan-out area F2.

Figure 4:
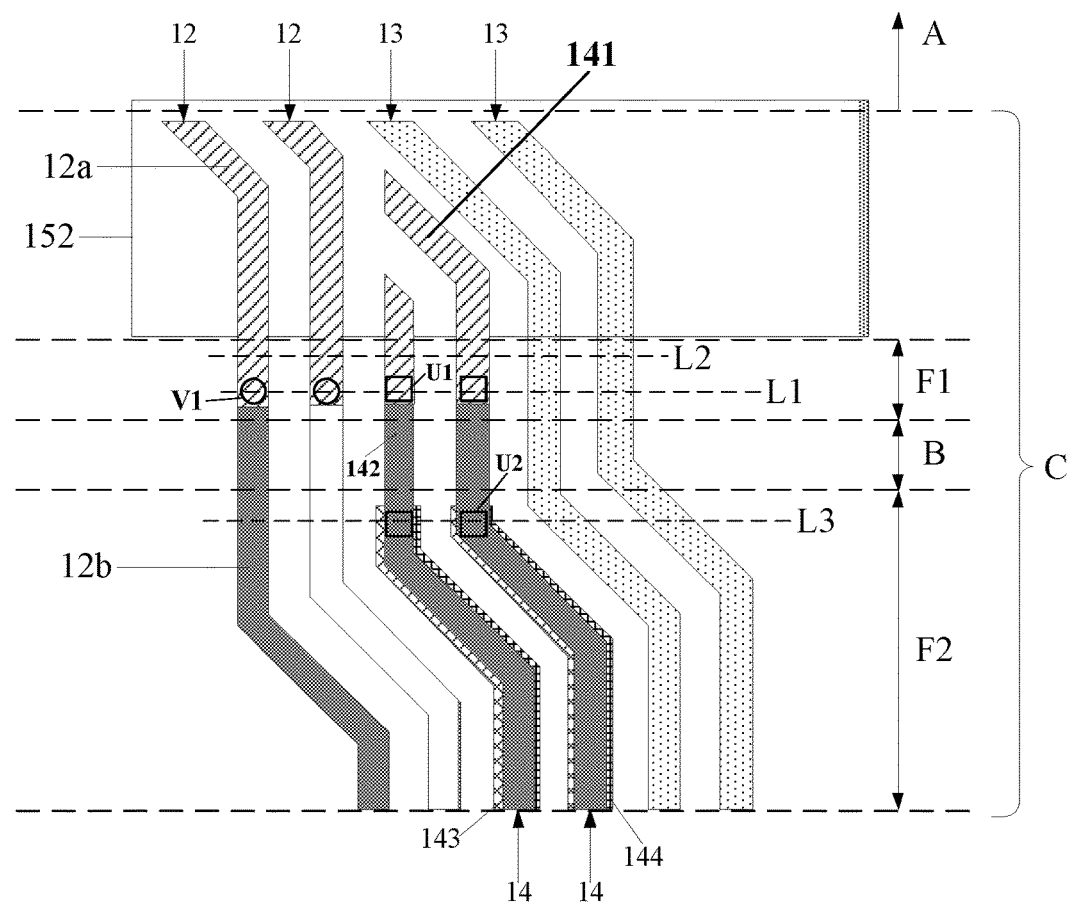
FIG. 4 is an enlarged schematic diagram at dashed box Q2 in FIG. 3.
Figure 5:
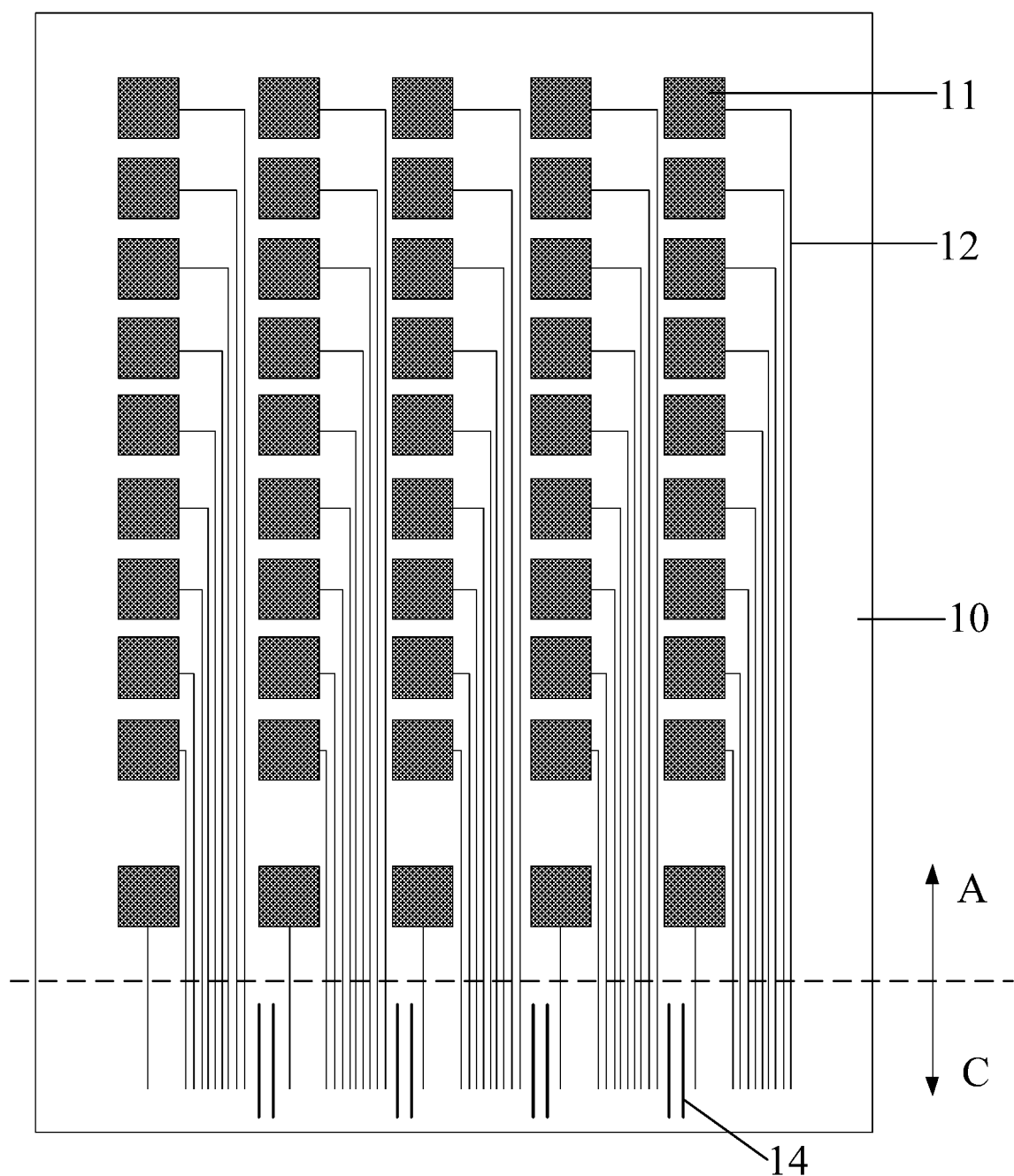
FIG. 5 is another schematic planar structural diagram of a display panel according to an embodiment of the present disclosure.

FIG. 4 is an enlarged schematic diagram at dashed box Q2 in FIG. 3. FIG. 5 is another schematic planer structural diagram of the display panel according to the embodiment of the present disclosure. With reference to FIGS. 3-5, the display panel according to the embodiment of the present disclosure may further include:

a substrate 10;

a plurality of touch electrodes 11, at least some of which are positioned on a portion, in the display area A, of the substrate 10; during specific implementation, most of the touch electrodes 11 in the display panel are positioned inside the display area A; in order to ensure a touch effect at an edge of the display area A, there are some touch electrodes 11 beyond the edge of the display area A at the edge; certainly, in some display panels having low requirements on the touch effect, each touch electrode 11 may also be positioned inside the display area A, which will not be limited herein;

a plurality of touch leads 12 positioned on the substrate 10, one ends of the touch leads 12 being coupled to the touch electrodes 11, the other ends thereof being positioned in the peripheral area C, the plurality of touch leads 12 in the display panel being divided into a plurality of touch lead sets 12M, and the touch lead set 12M including the plurality of touch leads 12;

a plurality of data leads 13 positioned on a portion, in the peripheral area C, of the substrate 10, the plurality of data leads 13 in the display panel being divided into a plurality of data lead sets 13M, the data lead set 13M including a plurality of data leads 13, and at least some of the touch lead sets 12M and some of the data lead sets 13M in the display panel being alternately distributed; and at least one shielding line 14 positioned on the portion, in the peripheral area C, of the substrate 10, an orthographic projection, on the substrate 10, of the shielding line 14 being positioned between an orthographic projection, on the substrate 10, of the touch lead 12 and an orthographic projection, on the substrate 10, of the data lead 13.

In the display panel according to the embodiment of the present disclosure, at least one shielding line is arranged, and the orthographic projection, on the substrate, of the shielding line is positioned between the orthographic projection, on the substrate, of the touch lead and the orthographic projection, on the substrate, of the data lead. Therefore, an electric field generated by the touch leads can be shielded, and coupling capacitance is prevented from being formed between the touch leads and the data leads. Accordingly, mutual interference between touch signals and data signals is relieved, thereby improving a display effect and a touch effect of the display panel.

In practical application, the shielding line may be configured to be positioned on the same film layer as the touch leads or the data leads. Alternatively, the shielding line is positioned on a film layer between the touch leads and the data leads. Since the electric field generated by the touch leads is radial, the shielding line is arranged in this way, so as to effectively shield the electric field generated by the touch leads. Accordingly, the mutual interference between the touch signals and the data signals is relieved.

With the touch electrodes 11 as self-capacitance electrodes as an example illustrated in FIG. 5, during specific implementation, the touch electrodes 11 may also be mutual capacitance electrodes, which will not be limited herein. As shown in FIG. 5, at least some of the touch electrodes 11 in the display panel are distributed in the display area A, and the touch signals are transmitted through the touch leads 12.

As shown in FIGS. 2 and 3, one ends of the touch leads are coupled to the touch electrodes in the display area, and the other ends thereof pass through the first fan-out area F1, the bendable area B, and the second fan-out area F2, so as to be coupled to an integrated drive chip IC. The integrated drive chip IC may be a touch display driver integration (TDDI) chip. With the touch leads being coupled to the integrated drive chip IC as an example illustrated in FIG. 2, during specific implementation, the touch leads may also be coupled to the drive chip through a flexible printed circuit (FPC). A connection mode of the touch leads will not be limited herein.

With reference to FIGS. 2 and 3 continuously, the display area A of the display panel is provided with a plurality of sub-pixels arranged in an array. A plurality of data lines are arranged in the display area A. The data lines are typically coupled to one column of sub-pixels. The data lines have the same extension directions as the touch leads. The data lines are coupled to the data leads. The data leads pass through the first fan-out area F1, the bendable area B, and the second fan-out area F2, so as to be coupled to the integrated drive chip IC. In the first fan-out area F1, the bendable area B, and the second fan-out area F2, the touch leads and the data leads are distributed in groups. That is, the plurality of touch leads in the display panel are divided into the plurality of touch lead sets 12M, and the plurality of data leads in the display panel are divided into the plurality of data lead sets 13M. In this way, the touch signals and the data signals are led out conveniently.

In some areas, close to the display area A, of the peripheral area C, due to the limitation of a routing space, in a direction perpendicular to the substrate 10, the touch lead sets 12M may partially overlap the data lead sets 13M. Therefore, in the embodiment of the present disclosure, at least some of the touch lead sets 12M and some of the data lead sets 13M in the display panel are alternately distributed. Certainly, when there is a sufficient routing space, all the touch lead sets 12M and all the data lead sets 13M in the display panel may be alternately distributed, which will not be limited herein.

In addition, the shielding line may be configured to be positioned in at least one of the first fan-out area, the bendable area, and the second fan-out area. With reference to FIGS. 2 and 3 continuously, since the integrated drive chip IC is small-sized, in order to couple the plurality of touch leads and the plurality of data leads to a position of the integrated drive chip IC, the first fan-out area F1 and the second fan-out area F2 are configured to be of a fan shape in which a side edge close to the display area A has a greater width than a side edge away from the display area A. Moreover, at least in the second fan-out area F2, the touch leads and the data leads are each provided with an inclined section inclined towards the integrated drive chip IC. In the first fan-out area F1, the bendable area B, and the second fan-out area F2, a distance between the touch lead and the data lead that are adjacent to each other is small. Therefore, the shielding line is arranged in at least one of the first fan-out area F1, the bendable area B, and the second fan-out area F2. Accordingly, coupling capacitance formed between the touch leads and the data leads can be effectively shielded, thereby greatly reducing the mutual interference between the touch signals and the data signals.

As shown in FIG. 2, in order to provide power supply signals for sub-pixels in the display area A, the above display panel may further include: a high-level power supply voltage signal line VDD in a non-display area, and a low-level power supply voltage signal line VSS. Moreover, the high-level power supply voltage signal line VDD and the low-level power supply voltage signal line VSS are coupled to the flexible printed circuit (FPC).

With reference to FIGS. 2 and 3, in the above display panel according to some embodiments of the present disclosure, the first fan-out area F1, the bendable area B, and the second fan-out area F2 are arranged. After the display panel is manufactured, the display panel may be bent at a position of the bendable area B, so as to bend the second fan-out area F2 of the display panel to one side, facing away from a display surface, of the display panel. Therefore, the signal lines such as the touch leads and the data leads in the second fan-out area F2 are coupled to the integrated drive chip IC on one side, facing away from the display surface, of the display area. Accordingly, a frame area of the display panel is greatly narrowed.

In practical application, in the above display panel according to the embodiment of the present disclosure, as shown in FIG. 4, the shielding line 14 is positioned in the first fan-out area F1, the bendable area B, and the second fan-out area F2.

The shielding line 14 may have the same shape as the data leads 13 positioned in the first fan-out area F1, the bendable area B, and the second fan-out area F2.

In the first fan-out area F1, the bendable area B, and the second fan-out area F2, the distance between the touch lead 12 and the data lead 13 that are adjacent to each other is small. Therefore, the shielding line 14 is arranged in the first fan-out area F1, the bendable area B, and the second fan-out area F2. Therefore, the coupling capacitance formed between the touch leads 12 and the data leads 13 can be more effectively shielded, thereby greatly reducing the mutual interference between the touch signals and the data signals. Moreover, the shielding line 14 is configured to have the shape as the data leads 13 positioned in the first fan-out area F1, the bendable area B, and the second fan-out area F2. Therefore, the routing space between the touch leads 12 and the data leads 13 can be fully utilized, and the shielding line 14 has a sufficient length, so as to ensure that the shielding line 14 has an excellent shielding effect.

Figure 6:
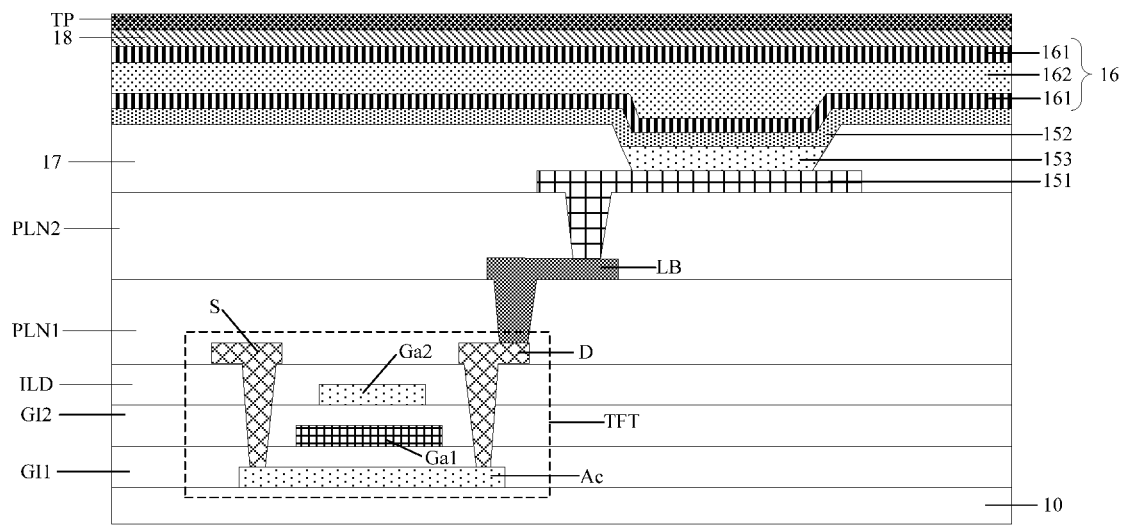
FIG. 6 is a schematic sectional view of a display panel in a display area according to an embodiment of the present disclosure.

FIG. 6 is a schematic sectional view of the display panel in the display area according to the embodiment of the present disclosure. As shown in FIG. 6, the above display panel in the embodiment of the present disclosure may further include: a plurality of first electrodes 151, second electrodes 152 positioned on one sides, facing away from the substrate 10, of the first electrodes 151, and light-emitting layers 153 positioned between the first electrodes 151 and the second electrodes 152. The second electrodes 152 may be arranged on an entire surface. A pixel definition layer 17 may further be arranged between a film layer on which the first electrode 151 is positioned and the light-emitting layer 153. The pixel definition layer 17 is configured to define an area of each sub-pixel. That is, a position at which an opening of the pixel definition layer 17 is positioned in the figure corresponds to one sub-pixel.

In addition, in order to drive each sub-pixel to emit light, the above display panel may further include: a thin film transistor (TFT), a capacitor structure, etc. The thin film transistor (TFT) may include: an active layer Ac, an input end S, an output end D, and a gate Ga1. The output end D of the thin film transistor (TFT) is coupled to the first electrode 151 through a conductive connector LB, and the gate Ga1 and a third electrode Ga2 constitutes the capacitor structure. In order to insulate conductive components of different film layers from one another, the above display panel may further include: a first gate insulation layer GI1 positioned between the active layer Ac and the gate Ga1, a second gate insulation layer GI2 positioned between the gate Ga1 and the third electrode Ga2, an interlayer insulation layer ILD positioned between the third electrode Ga2 and the input end S, a first planarization layer PLN1 positioned between the input end S and the conductive connector LB, and a second planarization layer PLN2 positioned between the conductive connector LB and the first electrode 151.

With reference to FIGS. 4-6, in the embodiment of the present disclosure, the orthographic projection, on the substrate 10, of the shielding line 14 overlaps an orthographic projection, on the substrate 10, of the second electrode 152. It can be seen from FIG. 4 that a certain space still exists between the touch lead 12 and the data lead 13 at an edge, close to the first fan-out area F1, of an area covered with the second electrode 152. Therefore, the shielding line 14 extends to the area covered with the second electrode 152, thereby further enhancing the shielding effect of the shielding line 14. In addition, as shown in FIG. 5, the orthographic projection, on the substrate 10, of the shielding line 14 does not overlap the orthographic projection, on the substrate 10, of the touch electrode 11. Accordingly, the situation that the shielding line 14 is connected to the touch electrode 11 in a shorted manner, thereby affecting the touch effect of the touch electrode 11 can be avoided.

During specific implementation, as shown in FIG. 6, the above display panel according to the embodiment of the present disclosure may further include: an encapsulation layer 16 positioned on one side, facing away from the substrate 10, of the second electrode 152, a touch electrode layer TP positioned on one side, facing away from the substrate 10, of the encapsulation layer 16, and a touch barrier layer 18 positioned between the encapsulation layer 16 and the touch electrode layer TP. The encapsulation layer 16 may include: organic film layers 162 and inorganic film layers 161 that are laminated. The inorganic film layers 161 can block water vapor and oxygen. The organic film layers 162 can be positioned between two adjacent inorganic film layers 161 and release stress and perform planarization. The touch electrode in the embodiment of the present disclosure is positioned in the touch electrode layer TP.

Figure 7:
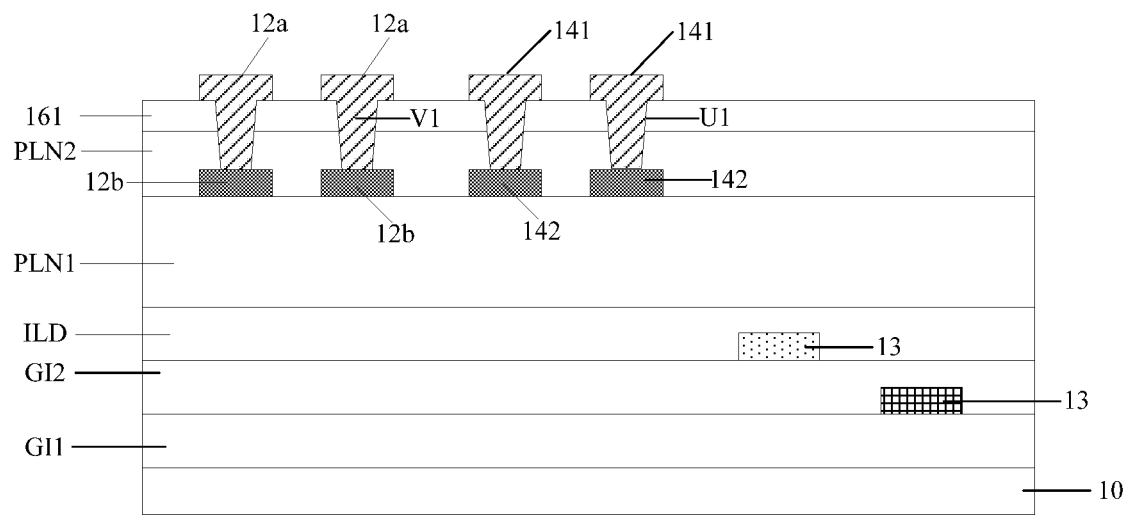
FIG. 7 is a schematic sectional view along dashed line L1 in FIG. 4.

FIG. 7 is a schematic sectional view along dashed line L1 in FIG. 4. With reference to FIGS. 4, 6, and 7, the above shielding line 14 may include: a first shielding sub-line 141 and a second shielding sub-line 142.

The first shielding sub-line 141 is positioned on one side, facing away from the substrate 10, of the encapsulation layer 16.

The second shielding sub-line 142 is positioned on one side, close to the substrate 10, of the first electrode 151.

An orthographic projection, on the substrate 10, of a first end of the first shielding sub-line 141 is positioned within a range of the orthographic projection, on the substrate, of the second electrode 152. A second end of the first shielding sub-line 141 is positioned in the first fan-out area F1. The second shielding sub-line 142 is positioned in the first fan-out area F1, the bendable area B, and the second fan-out area F2.

The second end of the first shielding sub-line 141 is coupled to the second shielding sub-line 142 through a first via hole U1, the first via hole U1 penetrating an insulation layer between the first shielding sub-line 141 and the second shielding sub-line 142.

Since the second electrodes 152 are typically arranged on the entire surface, in order to prevent the touch signals from being shielded by the second electrodes 152, the touch electrode layer TP is arranged on one side, facing away from the substrate 10, of the encapsulation layer 16. Therefore, in order to effectively relieve the mutual interference between the touch leads 12 and the data leads 13, the first shielding sub-line 141 is arranged on one side, facing away from the substrate 10, of the encapsulation layer 16. Moreover, in order to prevent the shielding line 14 from being broken at the bendable area B when the display panel is bent at the bendable area B, in the embodiment of the present disclosure, the shielding line 14 is configured as the first shielding sub-line 141 and the second shielding sub-line 142. The second shielding sub-line 142 is positioned on one side, close to the substrate 10, of the first electrode 151. The second end of the first shielding sub-line 141 is coupled to the second shielding sub-line 142 through the first via hole U1 positioned in the first fan-out area F1. Therefore, the first shielding sub-line 141 is switched to the second shielding sub-line 142 in the first fan-out area F1. The shielding line 14 undergoes small stress when being bent at the bendable area B. Accordingly, the shielding line 14 is unlikely to be broken at the bendable area B.

During specific implementation, in the above display panel according to embodiments of the present disclosure, with reference to FIGS. 4, 6, and 7, the touch lead 12 may include: a first lead portion 12a and a second lead portion 12b.

The first lead portion 12a is positioned on one side, facing away from the substrate 10, of the encapsulation layer 16. That is, the first lead portion 12a is positioned on the touch electrode layer TP. In addition, the touch electrodes are further arranged on the touch electrode layer TP.

The second lead portion 12b is positioned on one side, close to the substrate 10, of the first electrode 151.

A first end of the first lead portion 12a is coupled to the touch electrode, and a second end thereof is positioned in the first fan-out area F1. The second lead portion 12b is positioned in the first fan-out area F1, the bendable area B, and the second fan-out area F2.

A second end of the first lead portion 12a is coupled to the second lead portion 12b through a first through hole V1, the first through hole V1 penetrating an insulation layer between the first lead portion 12a and the second lead portion 12b.

The second shielding sub-line 142 is positioned on the same film layer as the second lead portion 12b.

The second electrodes 152 arranged in the entire surface are typically arranged in the display area of the display panel. In order to prevent the touch signals from being shielded by the second electrodes 152, the touch electrode layer TP is arranged on one side, facing away from the substrate 10, of the encapsulation layer 16. In order to prevent the touch lead 12 from being broken at the bendable area B when the display panel is bent at the bendable area B, in the embodiment of the present disclosure, the touch lead 12 is configured to include the first lead portion 12a and the second lead portion 12b. One end of the first lead portion 12a is coupled to the touch electrode in the touch electrode layer TP, and the other end thereof extends into the first fan-out area F1 and is coupled to the second lead portion 12b through the first through hole V1. Therefore, the touch lead 12 is switched to the second lead portion 12b at the first fan-out area F1. The touch lead 12 undergoes small stress when being bent at the bendable area B. Accordingly, the touch lead 12 is unlikely to be broken at the bendable area B.

In addition, the second shielding sub-line 142 is positioned on the same film layer as the second lead portion 12b. In a manufacturing process, the second shielding sub-line 142 and the second lead portion 12b may be manufactured through the same composition process, thereby reducing a manufacturing cost. Moreover, the second lead portion 12b may be positioned on the same film layer as the conductive connector LB in the display area. Therefore, the conductive connector LB, the second shielding sub-line 142, and the second lead portion 12b may be manufactured through the same composition process, thereby further reducing the manufacturing cost.

Figure 8:
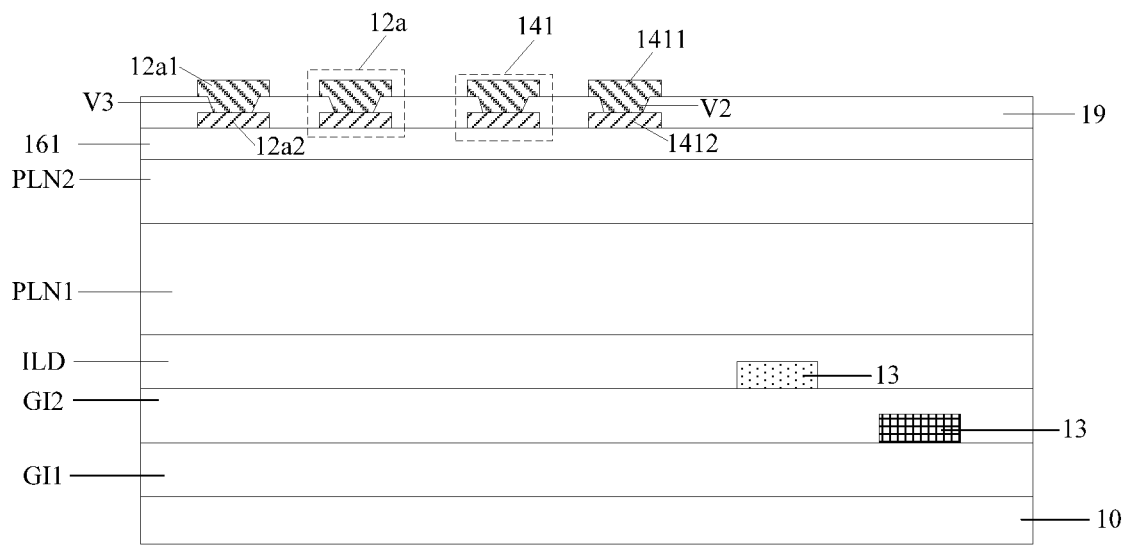
FIG. 8 is a schematic sectional view along dashed line L2 in FIG. 4.

FIG. 8 is a schematic sectional view along dashed line L2 in FIG. 4. As shown in FIG. 8, the first shielding sub-line 141 includes: a first wire 1411 and a second wire 1412 positioned on one side, close to the substrate 10, of the first wire 1411. The first wire 1411 is coupled to the second wire 1412 through a second through hole V2, the second through hole V2 penetrating an insulation layer 19 between the first wire 1411 and the second wire 1412.

The first lead portion 12a includes: a first lead 12a1 and a second lead 12a2 positioned on one side, close to the substrate 10, of the first lead 12a1. The first lead 12a1 is coupled to the second lead 12a2 through a third through hole V3, the third through hole V3 penetrating an insulation layer 19 between the first lead 12a1 and the second lead 12a2.

The first wire 1411 is positioned on the same film layer as the first lead 12a1. The second wire is positioned on the same film layer as the second lead.

During specific implementation, the touch electrode in the touch electrode layer may also include: a first touch sub-electrode and a second touch sub-electrode that are laminated. The first touch sub-electrode is coupled to the second touch sub-electrode through a through hole. In a manufacturing process, the first touch sub-electrode, the first wire, and the first lead may be manufactured through the same composition process. The second touch sub-electrode, the second wire, and the second lead may be manufactured through the same composition process, thereby reducing the manufacturing cost.

Figure 9:
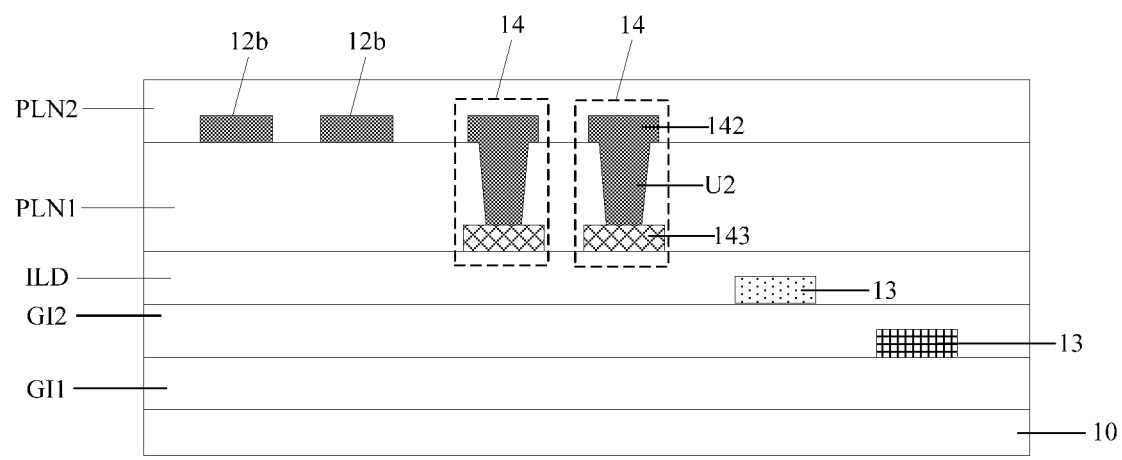
FIG. 9 is a schematic sectional view along dashed line L3 in FIG. 4.

Alternatively, FIG. 9 is a schematic sectional view along dashed line L3 in FIG. 4. As shown in FIGS. 4 and 9, in the above display panel provided in the embodiment of the present disclosure, the above shielding line 14 may further include: a third shielding sub-line 143 positioned in the second fan-out area F2.

The third shielding sub-line 143 is positioned on one side, close to the substrate 10, of the second shielding sub-line 142.

The second shielding sub-line 142 is coupled to the third shielding sub-line 143 through a second via hole U2. The second via hole U2 penetrates an insulation layer between the second shielding sub-line 142 and the third shielding sub-line 143. The second via hole U2 is positioned in the second fan-out area F2.

Since the electric field generated by the touch leads is radial, double-layer wires arranged in a laminated manner are employed as the shielding line 14. Both the second shielding sub-line 142 and the third shielding sub-line 143 play a role in shielding. Therefore, the shielding performance of the shielding line 14 can be improved, and a range capable of being shielded by the shielding line 14 can be wider, thereby further reducing the mutual interference between the touch signals and the data signals. Moreover, the second shielding sub-line 142 is coupled to the third shielding sub-line 143 through the second via hole U2. Therefore, a better shielding effect can be realized compared with two shielding sub-lines separately arranged. In addition, the second via hole U2 is provided in an area outside the bendable area B. Therefore, the display panel can be prevented from being broken, etc. when being bent at the bendable area B.

Figure 10:
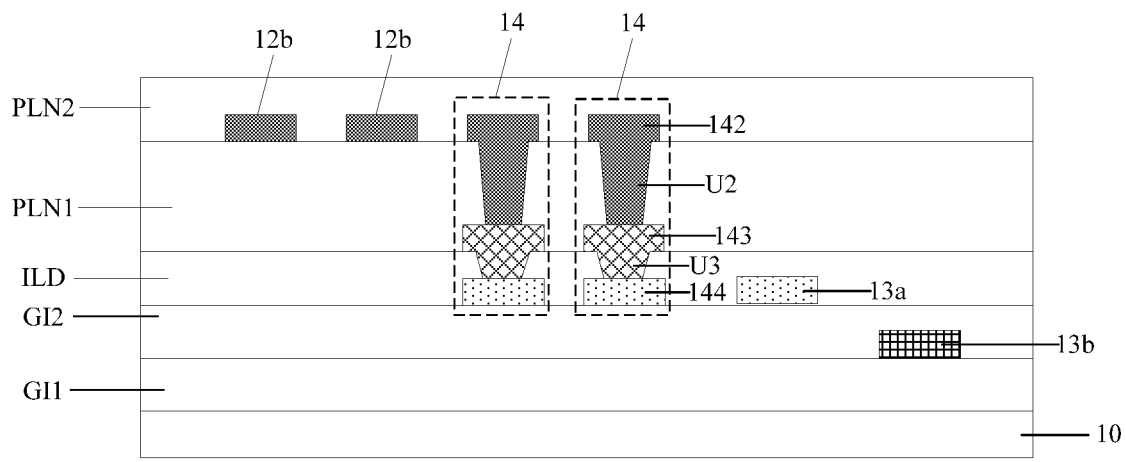
FIG. 10 is another schematic sectional view along dashed line L3 in FIG. 4.

FIG. 10 is another schematic sectional view along dashed line L3 in FIG. 4. As shown in FIGS. 4 and 10, in the above display panel according to the embodiment of the present disclosure, the shielding line 14 may further include: a fourth shielding sub-line 144 positioned in the second fan-out area F2.

The fourth shielding sub-line 144 is positioned on one side, close to the substrate 10, of the third shielding sub-line 143.

The third shielding sub-line 143 is coupled to the fourth shielding sub-line 144 through a third via hole U3. The third via hole U3 penetrates an insulation layer between the third shielding sub-line 143 and the fourth shielding sub-line 144.

Since the electric field generated by the touch leads is radial, the fourth shielding sub-line 144 is arranged on one side, close to the substrate 10, of the third shielding sub-line 143. The fourth shielding sub-line 144 is coupled to the third shielding sub-line 143 through the third via hole U3. The second shielding sub-line 142, the third shielding sub-line 143, and the fourth shielding sub-line 144 all play a role in shielding. Therefore, the shielding performance of the shielding line 14 is further improved, thereby further reducing the mutual interference between the touch signals and the data signals.

It should be noted that with the second shielding sub-line 142 being coupled to the third shielding sub-line 143 through one second via hole U2 as an example illustrated in the accompanying drawing in the embodiment of the present disclosure, during specific implementation, in order to enhance the conduction performance of the second shielding sub-line 142 and the third shielding sub-line 143, the second shielding sub-line 142 may also be coupled to the third shielding sub-line 143 through more second via holes U2. Similarly, the third shielding sub-line 143 may also be coupled to the fourth shielding sub-line 144 through more third via holes U3.

Alternatively, in the above display panel according to the embodiment of the present disclosure, as shown in FIG. 10, in the peripheral area, the plurality of data leads in the display panel may be divided into: a plurality of first data leads 13a positioned on a first metal layer, and a plurality of second data leads 13b positioned on a second metal layer. The second metal layer is positioned on one side, close to the substrate, of the first metal layer.

Orthographic projections, on the substrate 10, of the first data leads 13a and orthographic projections, on the substrate 10, of the second data leads 13b are alternately distributed.

In some embodiments of the present disclosure, the plurality of data leads positioned in the peripheral area are divided into the plurality of first data leads 13a and the plurality of second data leads 13b. The first data leads 13a and the second data leads 13b are positioned on different metal layers, and the first data leads 13a and the second data leads 13b are alternately distributed. In this way, adjacent data leads are positioned on different metal layers. Therefore, mutual interference between the adjacent data leads can be avoided, the display effect of the display panel can be improved, and an overall routing width can be reduced, thereby facilitating the design of a narrow frame. With reference to FIGS. 6 and 10, the first metal layer may be a film layer on which the third electrode Ga2 is positioned. That is, the first data leads 13a may be positioned on the same film layer as the third electrode Ga2. The second metal layer may be a film layer on which the gate Ga1 is positioned. That is, the second data leads 13b may be positioned on the same film layer as the gate Ga1. In the manufacturing process, the first data lead 13a and the third electrode Ga2 may be manufactured through the same composition process. The second data lead 13b and the gate Ga1 may be manufactured through the same composition process, thereby reducing the manufacturing cost.

In addition, the data leads are coupled to the data lines in the display area. The data lines in the display area may be positioned on the same film layer as the input end S of the thin film transistor (TFT). In the manufacturing process, the input end S and the output end D of the thin film transistor (TFT) and the data lines may be manufactured through the same composition process, thereby reducing the manufacturing cost.

During specific implementation, in the above display panel according to some embodiments of the present disclosure, as shown in FIG. 10, the fourth shielding sub-line 144 may be arranged on the same layer as the first data leads 13a.

Figure 11:
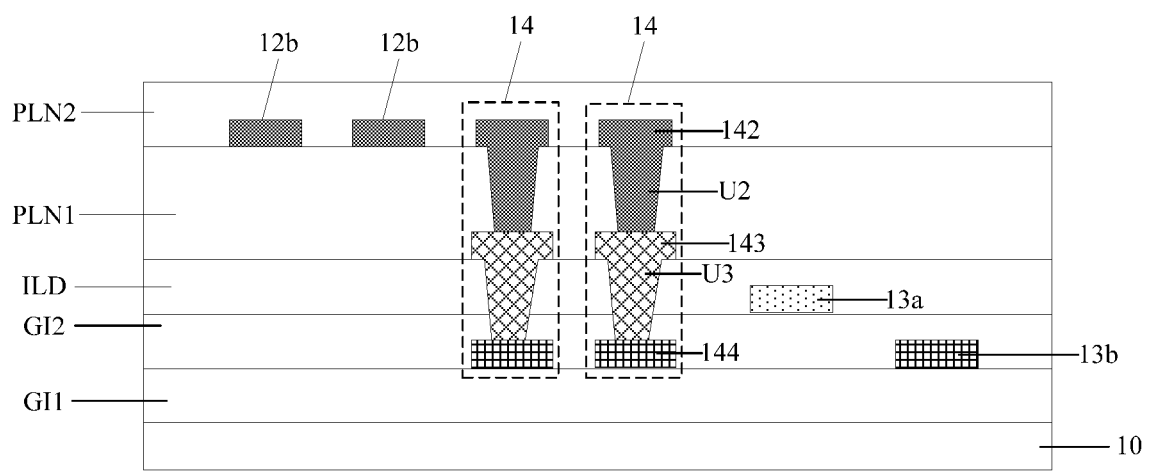
FIG. 11 is yet another schematic sectional view along dashed line L3 in FIG. 4.

FIG. 11 is yet another schematic sectional view along dashed line L3 in FIG. 4. As shown in FIG. 11, the fourth shielding sub-line 144 may be arranged on the same layer as the second data leads 13b.

Figure 12:
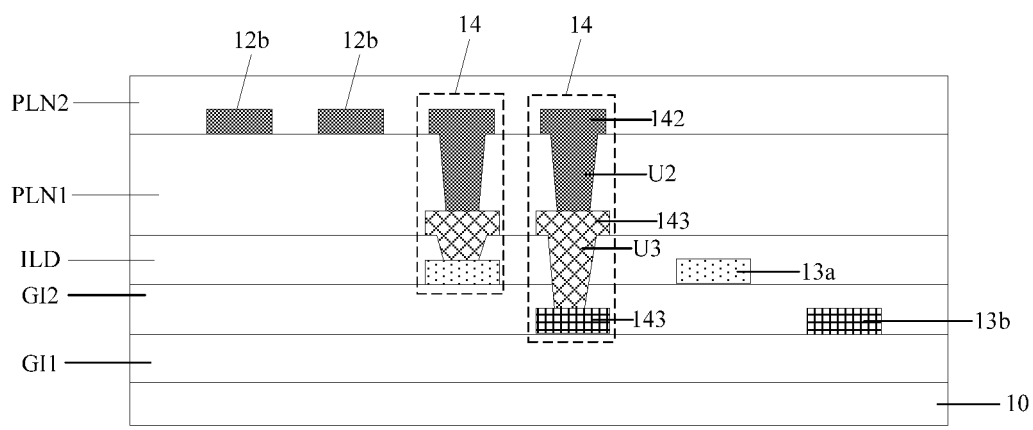
FIG. 12 is still another schematic sectional view along dashed line L3 in FIG. 4.

FIG. 12 is still another schematic sectional view along dashed line L3 in FIG. 4. As shown in FIG. 12, the fourth shielding sub-line 144 is arranged on the same layer as the first data leads 13a. Moreover, the fourth shielding sub-line 144 is arranged on the same layer as the second data leads 13b. That is, some of the plurality of fourth shielding sub-lines 144 are arranged on the same layer as the first data leads 13a, and the other fourth shielding sub-lines 144 are arranged on the same layer as the second data leads 13b.

In conclusion, the fourth shielding sub-lines 144 are arranged in the three above modes. The fourth shielding sub-lines 144 and the first data leads 13a or the second data leads 13b may be manufactured through the same composition process, thereby reducing the manufacturing cost.

Figure 13:
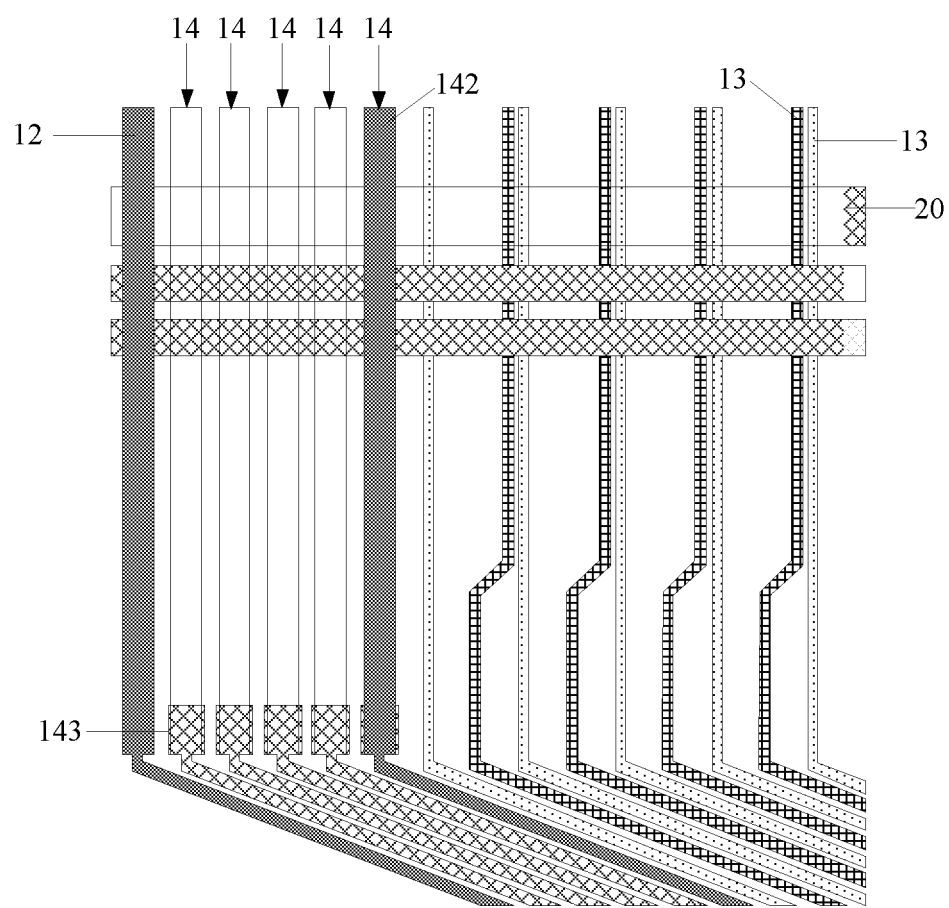
FIG. 13 is an enlarged schematic diagram at dashed box Q3 in FIG. 3.

FIG. 13 is an enlarged schematic diagram at dashed box Q3 in FIG. 3. As shown in FIGS. 3 and 13, the above display panel according to the embodiment of the present disclosure may further include: a test signal line 20 arranged on the same layer as the third shielding sub-line 143 and positioned in the second fan-out area F2.

An extension direction of the test signal line 20 intersects with an extension direction of the third shielding sub-line 143.

The orthographic projection, on the substrate, of the third shielding sub-line 143 does not overlap an orthographic projection, on the substrate, of the test signal line 20.

In this way, the situation that the third shielding sub-line 143 intersects with the test signal line 20, thereby affecting a test effect of the test signal line 20 can be avoided.

Figure 14:
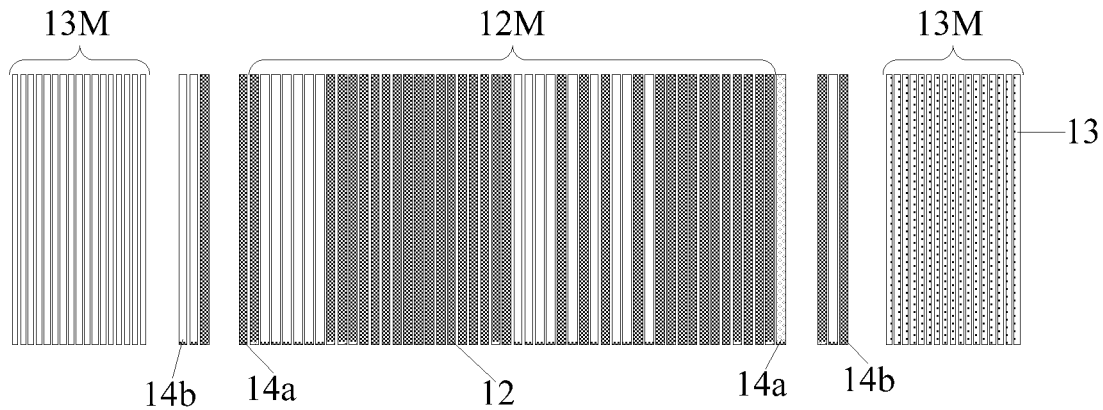
FIG. 14 is a schematic sectional view at dashed box Q4 in FIG. 3.

FIG. 14 is a schematic sectional view at dashed box Q4 in FIG. 3. As shown in FIGS. 3 and 14, in the above display panel according to the embodiment of the present disclosure, the shielding line 14 is positioned in a gap between the touch lead set 12M and the data lead set 13M.

The plurality of touch leads and the plurality of data leads in the display panel are distributed in groups. Therefore, the shielding line 14 is arranged in the gap between the touch lead set 12M and the data lead set 13M. Accordingly, coupling capacitance between the touch leads and the data leads can be effectively shielded, and the mutual interference between the touch signals and the data signals is small.

Alternatively, with reference to FIG. 14 continuously, the above display panel according to the embodiment of the present disclosure includes a plurality of shielding lines. The plurality of shielding lines in the display panel may include a plurality of ground lines 14b. At least one ground line 14b is arranged in a gap between the touch lead set 12M and the data lead set 13M that are adjacent to each other. In a drive process, fixed potential signals, such as ground signals, may be applied to the ground lines 14b, so as to improve a shielding effect of suspended touch leads 14a and the ground lines 14b.

In addition, the plurality of shielding lines in the above display panel may further include: a plurality of suspended touch leads 14a. At least one suspended touch lead 14a is arranged in the gap between the touch lead set 12M and the data lead set 13M that are adjacent to each other. The suspended touch lead 14a is positioned between the ground line 14b and the touch lead set 12M. In an actual drive process, the touch signals may be applied to the suspended touch leads 14a. For example, the touch signals applied to the suspended touch leads 14a may be the same signals as in the touch leads 12. Therefore, the suspended touch lines 14a are arranged on two sides of the touch lead set 12M, so as to apply the touch signals to both each touch lead 12 in the touch lead set 12M and the suspended touch lines 14a.

In some embodiments of the present disclosure, with two suspended touch leads 14a and two ground lines 14b being arranged in the gap between the touch lead set 12M and the data lead set 13M that are adjacent to each other as an example illustrated in FIG. 14, the number of the suspended touch leads 14a and the ground lines 14b is not limited herein. During specific implementation, the number of the suspended touch leads 14a and the ground lines 14b is rationally configured according to a size of the gap between the touch lead set 12M and the data lead set 13M that are adjacent to each other.

Figure 15:
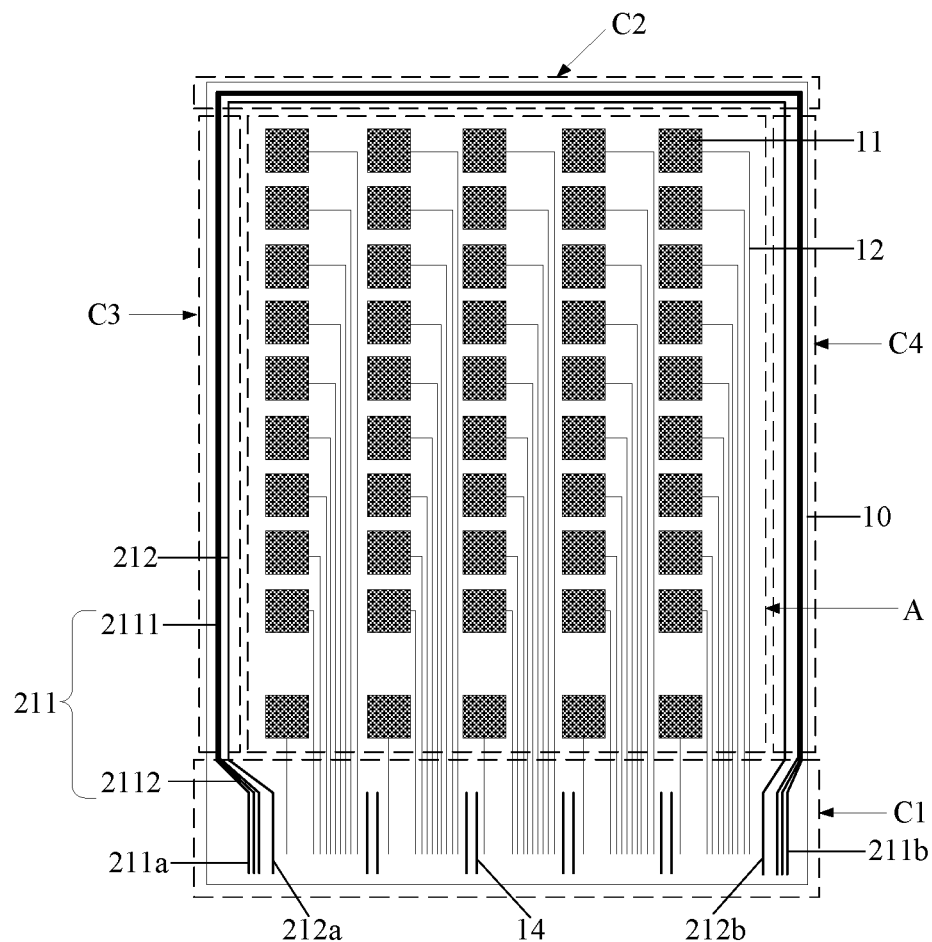
FIG. 15 is yet another schematic planer structural diagram of a display panel according to an embodiment of the present disclosure.

FIG. 15 is yet another schematic planer structural diagram of the display panel according to the embodiment of the present disclosure. As shown in FIG. 15, the above display panel according to the embodiment of the present disclosure may further include: a touch shielding line (as shown as 211 or 212 in FIG. 15) positioned on the substrate 10.

The peripheral areas include: a first peripheral area C1 and a second peripheral area C2 that are arranged opposite each other, and a third peripheral area C3 and a fourth peripheral area C4 that are arranged opposite each other. The shielding line 14 is positioned in the first peripheral area C1.

A first end 211a (or 212a) and a second end 211b (or 212b) of the touch shielding line 211 (or 212) are positioned in the first peripheral area C1. The touch shielding line 211 (or 212) passes through the second peripheral area C2, the third peripheral area C3, and the fourth peripheral area C4. The touch shielding line 211 (or 212) surrounds each touch electrode 11 in the display panel.

In this way, an influence from external interference on the touch electrodes 11 can be shielded through the touch shielding line 211 (or 212) surrounding each touch electrode 11 in the display panel, thereby improving the touch effect of the display panel.

During specific implementation, in the above display panel according to some embodiments of the present disclosure, with reference to FIG. 15 continuously, the touch shielding lines in the display panel include: a first touch shielding line 211 and a second touch shielding line 212. The second touch shielding line 212 is positioned on one side, close to the touch electrode 11, of the first touch shielding line 211. In the embodiment of the present disclosure, two touch shielding lines, that is, the first touch shielding line 211 and the second touch shielding line 212 are arranged. In practical application, different signals may be applied to the first touch shielding line 211 and the second touch shielding line 212. Therefore, the shielding effect is improved, and the influence from the external interference on the touch electrode 11 is further shielded.

Alternatively, in the above display panel according to some embodiments of the present disclosure, as shown in FIG. 15, the first touch shielding line 211 may include: a first touch shielding sub-line 2111, and at least two second touch shielding sub-lines 2112.

The first touch shielding sub-line 2111 is positioned in the second peripheral area C2, the third peripheral area C3, and the fourth peripheral area C4. The second touch shielding sub-line 2112 is coupled to the first touch shielding sub-line 2111, and the second touch shielding sub-line 2112 is positioned in the first peripheral area C1.

That is, the first touch shielding line 211 is a signal line (that is, the first touch shielding sub-line 2111) in the second peripheral area C2, the third peripheral area C3, and the fourth peripheral area C4. The first touch shielding line 211 extends to the first peripheral area C1 and then is divided into at least two signal lines (that is, the second touch shielding sub-lines 2112). With the first touch shielding line 211 including three second touch shielding sub-lines 2112 as an example illustrated in FIG. 15, during specific implementation, the first touch shielding line may be configured as actually required.

In this way, the first touch shielding line 211 is provided with at least two first ends 211a and at least two second ends 211b, thereby facilitating coupling to pins of other components. In the drive process, a fixed signal, such as a ground signal, may be applied to the first touch shielding line 211. A touch signal may be applied to the second touch shielding line 212. Therefore, an excellent shielding effect is realized.

In practical application, in the above display panel according to some embodiments of the present disclosure, as shown in FIG. 15, in the second peripheral area C2, the third peripheral area C3, and the fourth peripheral area C4, the first touch shielding line 211 has a greater line width than the second touch shielding line 212. That is, the greater the distance from the touch electrode 11 is, the greater the line width of the touch shielding line is. Therefore, the shielding effect of the touch shielding line on external interference can be improved, and the touch effect of the display panel is improved.

On the basis of the same inventive concept, a display device is further provided in an embodiment of the present disclosure. The display device includes any one of the above display panels. The display device may be applied to any product or component having a display function such as a mobile phone, a tablet computer, a television, a display, a notebook computer, a digital photo frame, and a navigator. The principles of the display device to solve the problem are similar to those of the above display panel. Therefore, reference may be made to implementation of the above display panel for implementation the display device, and the repetitions will not be repeated.

The display device according to some embodiments of the present disclosure may further include an integrated drive chip.

All touch leads, all data leads, and all shielding lines in the display panel are coupled to the integrated drive chip.

The display panel is bent at a bendable area. A second fan-out area of the display panel and the integrated drive chip are positioned on one side, facing away from a display surface, of the display panel.

During specific implementation, after being manufactured, the display panel may be bent at a position of the bendable area, so as to bend the second fan-out area of the display panel to one side, facing away from the display surface, of the display panel. Therefore, signal lines such as touch leads and data leads in the second fan-out area are coupled to the integrated drive chip on one side, facing away from the display surface, of the display area, thereby greatly narrowing a frame area of the display panel.

In the display panel and the display device according to embodiments of the present disclosure, at least one shielding line is arranged, and the orthographic projection, on the substrate, of the shielding line is positioned between the orthographic projection, on the substrate, of the touch leads and the orthographic projection, on the substrate, of the data lead. Therefore, the electric field generated by the touch leads can be shielded, and coupling capacitance can be prevented from being formed between the touch leads and the data leads. Accordingly, the mutual interference between the touch signals and the data signals is relieved, thereby further improving the display effect and the touch effect of the display panel.

Although the preferred embodiments of the present disclosure have been described, those skilled in the art can make additional alterations and modifications to these embodiments once they know the basic creative concept. Thus, it is intended that the appended claims are to be interpreted as including the preferred embodiments and all alterations and modifications falling within the scope of the present disclosure.

Apparently, those skilled in the art can make various modifications and variations to the embodiments of the present disclosure without departing from the spirit and scope of the embodiments of the present disclosure. In this way, if these modifications and variations to the embodiments of the present disclosure fall within the scope of the claims of the present disclosure and their equivalents, it is intended that the present disclosure also encompass these modifications and variations.

What is claimed is:

1. A display panel, comprising: a display area and a peripheral area positioned on at least one side of the display area; wherein
the display panel further comprises:
a substrate;
a plurality of touch electrodes, at least some of the plurality of touch electrodes are positioned on a portion, in the display area, of the substrate;
a plurality of touch leads positioned on the substrate, one ends of the plurality of touch leads being coupled to the touch electrodes, the other ends of the plurality of touch leads being positioned in the peripheral area, the plurality of touch leads in the display panel being divided into a plurality of touch lead sets, and each of the touch lead sets comprising touch leads;
a plurality of data leads positioned on a portion, in the peripheral area, of the substrate, the plurality of data leads in the display panel being divided into a plurality of data lead sets, each of the plurality of data lead sets comprising data leads, and at least some of the plurality of touch lead sets and some of the plurality of data lead sets being alternately distributed; and
at least one shielding line positioned on the portion, in the peripheral area, of the substrate, an orthographic projection, on the substrate, of the shielding line being positioned between an orthographic projection, on the substrate, of the touch leads and an orthographic projection, on the substrate, of the data leads;
wherein the peripheral area comprises a first fan-out area, a second fan-out area positioned on one side, away from the display area, of the first fan-out area, and a bendable area positioned between the first fan-out area and the second fan-out area; wherein
the shielding line is positioned in at least one of the first fan-out area, the bendable area, or the second fan-out area;
wherein the display panel further comprises: a plurality of first electrodes, second electrodes positioned on one sides, facing away from the substrate, of the first electrodes, and light-emitting layers positioned between the first electrodes and the second electrodes; wherein
the orthographic projection, on the substrate, of the shielding line overlaps an orthographic projection, on the substrate, of the second electrodes and does not overlap an orthographic projection, on the substrate, of the touch electrodes.

2. The display panel according to claim 1, further comprising: an encapsulation layer positioned on one side, facing away from the substrate, of the second electrodes; wherein
the shielding line comprises a first shielding sub-line and a second shielding sub-line;
the first shielding sub-line is positioned on one side, facing away from the substrate, of the encapsulation layer;
the second shielding sub-line is positioned on one side, close to the substrate, of the first electrode;
an orthographic projection, on the substrate, of a first end of the first shielding sub-line is positioned within a range of the orthographic projection, on the substrate, of the second electrodes, and a second end of the first shielding sub-line is positioned in the first fan-out area; the second shielding sub-line is positioned in the first fan-out area, the bendable area, and the second fan-out area; and
the second end of the first shielding sub-line is coupled to the second shielding sub-line through a first via hole, the first via hole penetrating an insulation layer between the first shielding sub-line and the second shielding sub-line.

3. The display panel according to claim 2, wherein each of the plurality of touch leads comprises a first lead portion and a second lead portion; wherein
the first lead portion is positioned on one side, facing away from the substrate, of the encapsulation layer;
the second lead portion is positioned on one side, close to the substrate, of the first electrode;
a first end of the first lead portion is coupled to the touch electrodes, and a second end thereof is positioned in the first fan-out area; the second lead portion is positioned in the first fan-out area, the bendable area, and the second fan-out area;
a second end of the first lead portion is coupled to the second lead portion through a first through hole, the first through hole penetrating an insulation layer between the first lead portion and the second lead portion; and the second shielding sub-line is positioned on a film layer same as a film layer where the second lead portion is.

4. The display panel according to claim 3, wherein the first shielding sub-line comprises: a first wire and a second wire positioned on one side, close to the substrate, of the first wire, wherein the first wire is coupled to the second wire through a second through hole, the second through hole penetrating an insulation layer between the first wire and the second wire; and the first lead portion comprises a first lead and a second lead positioned on one side, close to the substrate, of the first lead, wherein the first lead is coupled to the second lead through a third through hole, the third through hole penetrating an insulation layer between the first lead and the second lead; wherein the first wire is positioned on a film layer same as a film layer where the first lead is, and the second wire is positioned on a film layer same as a film layer where the second lead is.

5. The display panel according to claim 2, wherein the shielding line further comprises: a third shielding sub-line positioned in the second fan-out area; wherein the third shielding sub-line is positioned on one side, close to the substrate, of the second shielding sub-line; and the second shielding sub-line is coupled to the third shielding sub-line through a second via hole, the second via hole penetrating an insulation layer between the second shielding sub-line and the third shielding sub-line, and the second via hole being positioned in the second fan-out area.

6. The display panel according to claim 5, wherein the shielding line further comprises: a fourth shielding sub-line positioned in the second fan-out area; wherein the fourth shielding sub-line is positioned on one side, close to the substrate, of the third shielding sub-line; and the third shielding sub-line is coupled to the fourth shielding sub-line through a third via hole, the third via hole penetrating an insulation layer between the third shielding sub-line and the fourth shielding sub-line.

7. The display panel according to claim 6, wherein in the peripheral area, the plurality of data leads in the display panel are divided into a plurality of first data leads positioned on a first metal layer and a plurality of second data leads positioned on a second metal layer, the second metal layer being positioned on one side, close to the substrate, of the first metal layer; wherein orthographic projections, on the substrate, of the first data leads and orthographic projections, on the substrate, of the second data leads are alternately distributed.

8. The display panel according to claim 7, wherein the fourth shielding sub-line is arranged on a layer same as a layer where the first data leads are and/or a layer where the second data leads are.

9. The display panel according to claim 1, wherein the shielding line is positioned in a gap between the touch lead set and the data lead set.

10. The display panel according to claim 9, comprising a plurality of shielding lines; and the plurality of shielding lines in the display panel comprise a plurality of ground lines, wherein at least one ground line is arranged in a gap between the touch lead set and the data lead set that are adjacent to each other.

11. The display panel according to claim 10, wherein the plurality of shielding lines in the display panel further comprise: a plurality of suspended touch leads; wherein at least one suspended touch lead is arranged in the gap between the touch lead set and the data lead set that are adjacent to each other, the suspended touch lead being positioned between the ground line and the touch lead set.

12. The display panel according to claim 1, further comprising: a touch shielding line positioned on the substrate; wherein the peripheral areas comprise: a first peripheral area and a second peripheral area that are arranged opposite each other, and a third peripheral area and a fourth peripheral area that are arranged opposite each other, the shielding line being positioned in the first peripheral area; and a first end and a second end of the touch shielding line are positioned in the first peripheral area, and the touch shielding line passes through the second peripheral area, the third peripheral area, and the fourth peripheral area and surrounds each touch electrode in the display panel.

13. The display panel according to claim 12, wherein the touch shielding lines in the display panel comprise: a first touch shielding line and a second touch shielding line, wherein the second touch shielding line is positioned on one side, close to the touch electrode, of the first touch shielding line.

14. The display panel according to claim 13, wherein the first touch shielding line comprises a first touch shielding sub-line and at least two second touch shielding sub-lines; wherein the first touch shielding sub-line is positioned in the second peripheral area, the third peripheral area, and the fourth peripheral area; and the second touch shielding sub-line is coupled to the first touch shielding sub-line and positioned in the first peripheral area.

15. The display panel according to claim 13, wherein in the second peripheral area, the third peripheral area, and the fourth peripheral area, a width of the first touch shielding line is greater than a width of the second touch shielding line.

16. A display device, comprising a display panel, wherein the display panel comprises: a display area and a peripheral area positioned on at least one side of the display area; wherein the display panel further comprises:
a substrate;
a plurality of touch electrodes, at least some of the plurality of touch electrodes are positioned on a portion, in the display area, of the substrate;
a plurality of touch leads positioned on the substrate, one ends of the plurality of touch leads being coupled to the touch electrodes, and other ends of the plurality of touch leads being positioned in the peripheral area, the plurality of touch leads in the display panel being divided into a plurality of touch lead sets, and each of the touch lead sets comprising touch leads;
a plurality of data leads positioned on a portion, in the peripheral area, of the substrate, the plurality of data leads in the display panel being divided into a plurality of data lead sets, each of the plurality of data lead sets comprising data leads, and at least some of the plurality of touch lead sets and some of the plurality of data lead sets being alternately distributed; and
at least one shielding line positioned on the portion, in the peripheral area, of the substrate, an orthographic projection, on the substrate, of the shielding line being positioned between an orthographic projection, on the substrate, of the touch leads and an orthographic projection, on the substrate, of the data leads;

wherein the peripheral area comprises a first fan-out area, a second fan-out area positioned on one side, away from the display area, of the first fan-out area, and a bendable area positioned between the first fan-out area and the second fan-out area; wherein the shielding line is positioned in at least one of the first fan-out area, the bendable area, or the second fan-out area;

wherein the display panel further comprises: a plurality of first electrodes, second electrodes positioned on one sides, facing away from the substrate, of the first electrodes, and light-emitting layers positioned between the first electrodes and the second electrodes; wherein the orthographic projection, on the substrate, of the shielding line overlaps an orthographic projection, on the substrate, of the second electrodes and does not overlap an orthographic projection, on the substrate, of the touch electrodes.

\* \* \* \* \*